United States Patent [19]
Laing et al.

[11] Patent Number: 5,286,305
[45] Date of Patent: Feb. 15, 1994

[54] PHOTOVOLTAIC POWER PLANT

[76] Inventors: Johannes N. Laing; Inge Laing, both of 1253 La Jolla Rancho Rd., La Jolla, Calif. 92037

[21] Appl. No.: 898,160

[22] Filed: Jun. 15, 1992

[51] Int. Cl.⁵ .......................................... H01L 31/052
[52] U.S. Cl. .................................... 136/246; 126/565; 126/568; 126/698; 136/248
[58] Field of Search ................. 136/246, 248; 126/698, 126/565, 568

[56] References Cited

U.S. PATENT DOCUMENTS 4,289,112  9/1981  Roseen ................... 126/568
4,771,764  9/1988  Cluff ..................... 126/577

FOREIGN PATENT DOCUMENTS 58-48477  3/1983  Japan ................... 136/246

Primary Examiner—Aaron Weisstuch

[57] ABSTRACT

Solar power plant consisting of elongated modules whose longitudinal axes lie in a plane parallel to the direction of the sun rays to be converted. These modules are covered by lenses which refract sun rays impinging under an oblique angle downwards and which comprise two groups of refracting portions mirror-symmetrically arranged along the zenithal line which portions converge the refracted, downwardly directed sun beams into wedges of rays. These wedges of rays run twice per day in a vertical plane and during the remaining sunshine hours move within a narrow angular interval either towards the sun or away from the sun. This angular motion results in a vertical movement of the focal line so that the focal line coincides only twice per day with the height of the strip type photovoltaic cells. To force all wedges of rays to impinge evenly distributed onto the photovoltaic cell, a secondary lens is arranged above the photovoltaic cells. The light incident surface and shape of this lens produces the desired effect.

9 Claims, 3 Drawing Sheets

PHOTOVOLTAIC POWER PLANT

BACKGROUND OF THE INVENTION

Solar power plants floating on a body of water described so far have the disadvantage that the photovoltaic cells have to follow the height of the focal line which changes with changing sun elevation.

SUMMARY OF THE INVENTION

The invention overcomes this disadvantage by a concentrator lens which refracts the noon rays into wedges of rays which are tilted in the direction of the sun by about the same measure of angle as the wedges of rays appertaining to low angles of incidence are tilted in the opposite direction and by a secondary lens whose entrance surface is placed above the geometric locus of the focal point of a vertical wedge of rays and whose exit surface is below the focal point of the wedge of rays with maximum tilt.

DESCRIPTION OF THE PREFERRED EMBODIMENTS OF THE INVENTION

Figure 1:
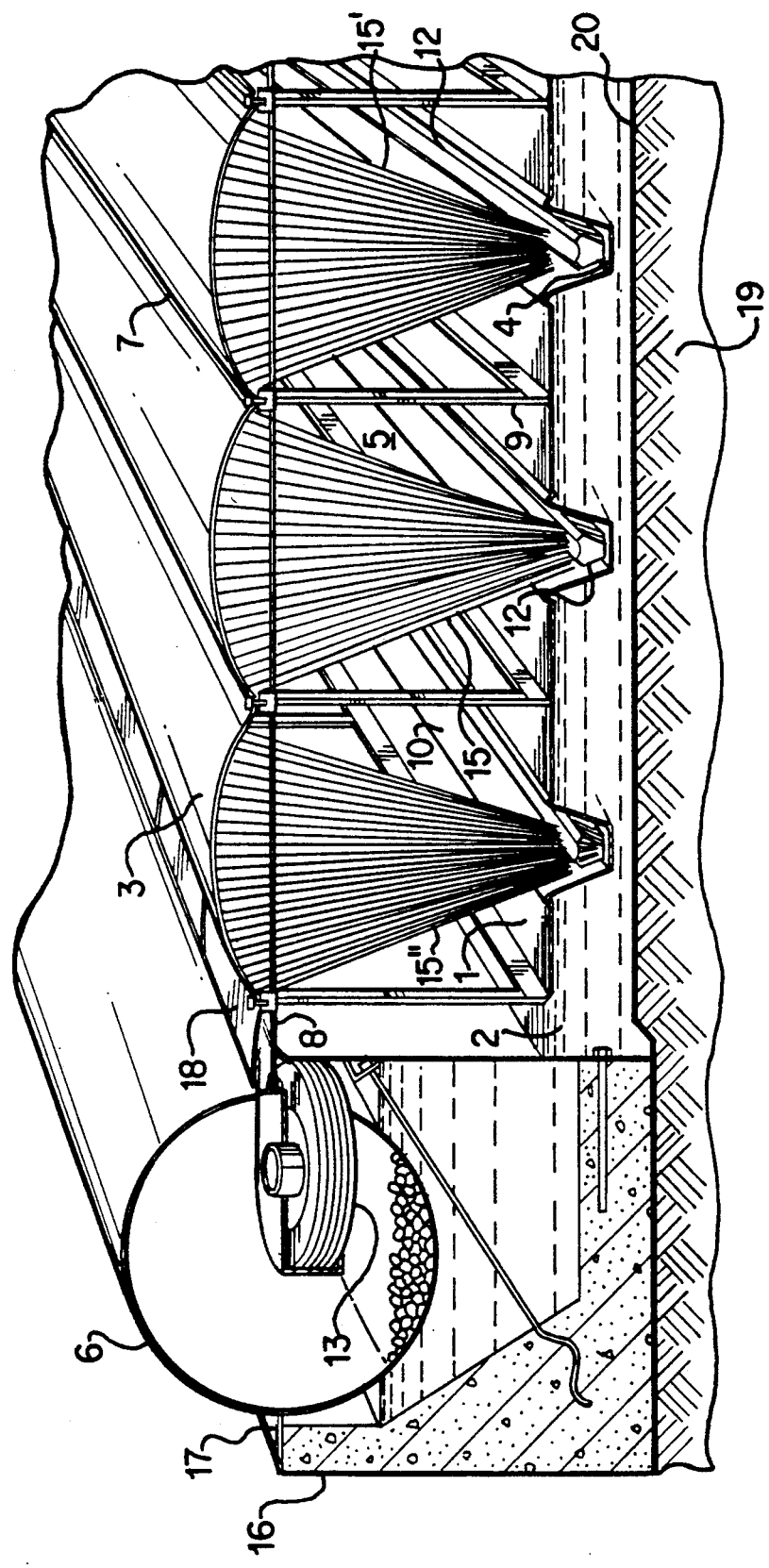
FIG. 1 shows in a vertical cross section a part of a floating platform.

FIG. 1 shows a cross section through part of a floating circular platform which is carried by a thin layer of water 2. The platform consists of concentrator tunnels 5 running parallel to each other which are composed of elongated sheet metal profiles 1, optical concentrator panels 3 and photovoltaic converters 4. The tunnels 5 are fastened to a toroidal tube 6 by a net of steel cords 8 and sheet metal bars 7 which keep the tunnels at a fixed distance from each other. The net is prevented from sagging flat pipes 9 which act also as down spouts for rain water. A trough 10 forming part of profile 1 runs along the middle line of each concentrator tunnel 5 and holds the photovoltaic cells 4. The roof is formed by concentrator panels 3 which not only converge the sun rays by a first set of prisms but also deflect the originating wedges of rays downwards by a second set of prisms. The photovoltaic cells 4 are arranged between bar-like secondary lenses 12 and the bottom of troughs 10. The toroidal tube 6, which is centered by rollers 13, rotates the platform around its vertical axis with the angular velocity of the sun, so that the photovoltaic cells follow the azimuth of the sun. During the night the platform moves back into the morning position. The secondary lenses 12 refract the wedges of rays independent of the position of the respective focal line onto the photovoltaic cells 4. A vertically impinging wedge of rays 15 is shown within the concentrator tunnel 5. Wedge of rays 15' however lies in an inclined plane. Wedge of rays 15" shows the situation in which the wedge of rays has moved to the left for instance due to a difference in heat expansion between the steel cords 18 and the sheet metal profile 1. The gap between the toroidal tube 6 and a wall 16 is bridged by a sliding film 17. Another film 18 covers the distance between the toroidal tube 6 and the adjacent concentrator tunnel 5 so that no water will evaporate. The waste heat of the photovoltaic cells which is not reradiated during sunshine hours will be stored in the water layer 2 which is separated from the subsoil 19 by film 20. The heat stored by the water will be dissipated during 24 hours daily by convection and infrared radiation.

The optical concentrator panels 3 are covered by a multiple of transparent films, whereby the uppermost at the time can be peeled off if damaged.

Figure 2A:
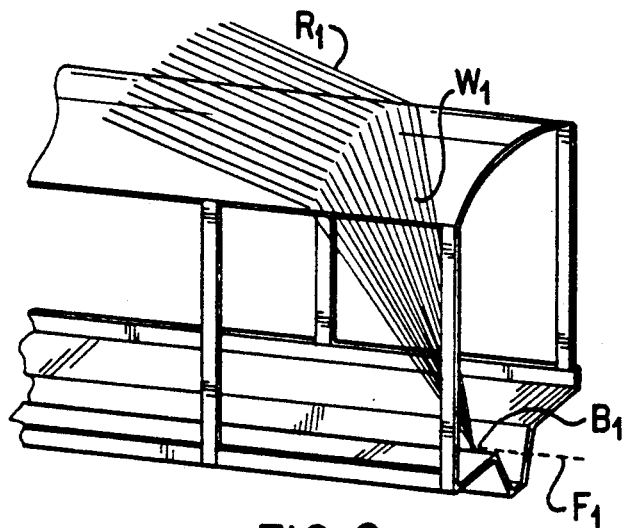
FIG. 2a, 2b, and 2c show the refraction of the insolation appertaining to different sun elevations.

FIG. 2 shows the function of the concentrating lens. FIG. 2a shows that in the early morning and late afternoon hours the wedges of rays experience the greatest refraction by the concentrator panels 3. The refracted wedge of rays $W_1$ forms an angle of about $-18°$ with a vertical plane. At this inclination the focal line $F_1$ has reached its highest level with the focal point $B_1$ lying on the side of the vertical plane averted from the sun.

Figure 2B:
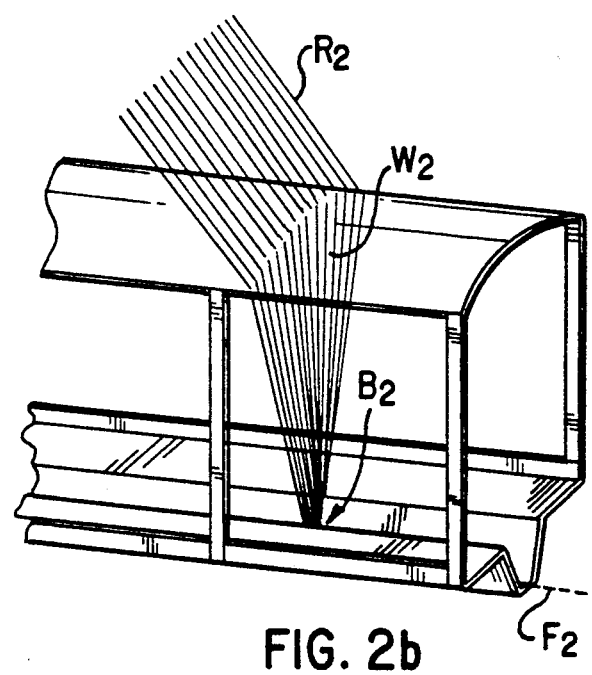

FIG. 2b shows that once in the morning and once in the afternoon at a sun elevation of about 60° the wedges of rays $W_2$ run on a vertical plane. In this position the theoretic focal line $F_2$ lies far below the photovoltaic cell 4 under the trough.

Figure 2C:
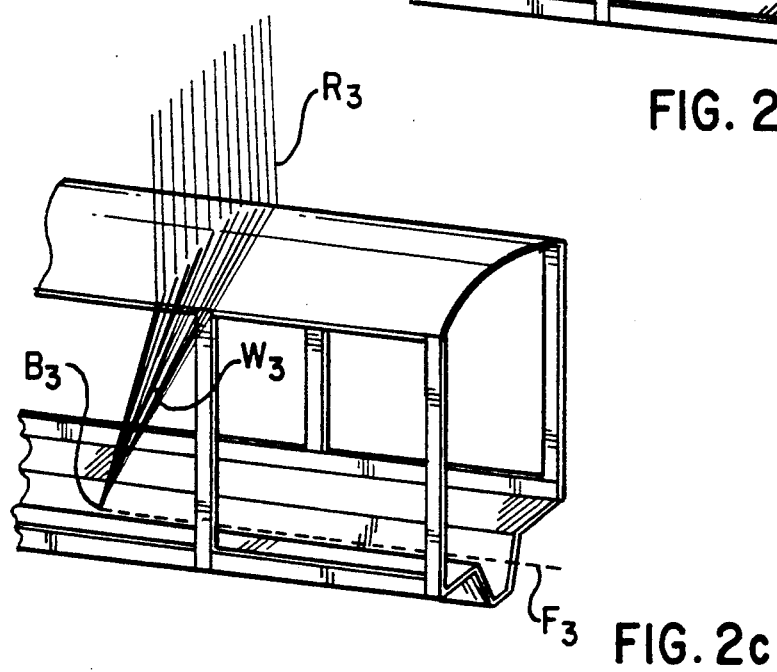

FIG. 2c shows that the sun rays at noon will be refracted in such a way that the wedges of rays $W_3$ run within a plane which forms an angle of $+18°$ with a vertical plane. At this angle of incidence the focal line $F_3$ again reaches the same position as in FIG. 2a whereby the focal point $B_3$ of said wedge of rays lies on the side of the vertical plane facing the sun.

FIG. 3 shows the path of rays within the secondary lens 12. The wedges of rays $W_1$ and $W_3$ impinging on the secondary lens 12 under an angle of about $\pm 18°$ to the vertical are refracted so that these wedges of rays are incident the photovoltaic cell 4 with an angle of $\pm 11.9°$. In addition to the refraction around an axis perpendicular to the extension of the photovoltaic cell 4 a concentrating refraction takes place parallel to the cells as in fresnel lenses. Since the focal distance remains constant the focal line moves upwards with increasing angle of the wedge of rays with the normal. The photovoltaic cell 4 however has a constant distance from the concentrator panels 3 thus the vertical movement of the focal line F has to be adjusted by the secondary lens 12. To attain this aim a geometry for the lens is chosen in which the entrance surface E of the secondary lens 12 has two convex areas $E_1$ adjacent to the rims and a concave area $E_2$ in the center. The plane side walls $S_1$ and $S_2$ of the lens 12 converge towards the photovoltaic cell 4.

Figure 3A:
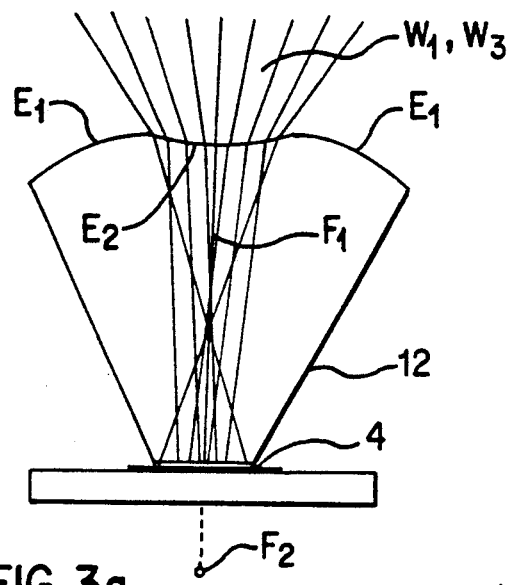
FIG. 3a, 3b, and 3c show in a vertical cross section the paths of rays within the secondary lens.

FIG. 3a shows that in the early morning, at noon, and late afternoon the focal line $F_1$ appertaining to the lowest as well as to the steepest sun rays falls within the bar-shaped secondary lens 12. At the two extreme sloping positions of the wedges of rays $W_1$ and $W_3$ the focal line $F_1$ has its largest vertical distances from the geometric locus of the focal line $F_2$ appertaining to the vertical wedge of rays $W_2$.

Figure 3B:
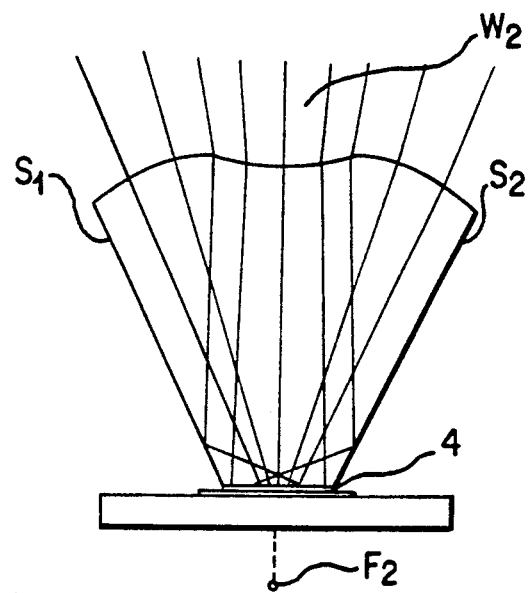

FIG. 3b shows that between these two extremes the focal line F moves downward and has its deepest position $F_2$ at a certain sun elevation between said extremes when the wedge of rays $W_2$ runs vertical. Due to the curvature of the entrance surfaces $E_1$ and $E_2$ of the lens 12 and total reflection on the surfaces $S_1$ and $S_2$, all rays impinge on the photovoltaic cell 4.

Figure 3C:
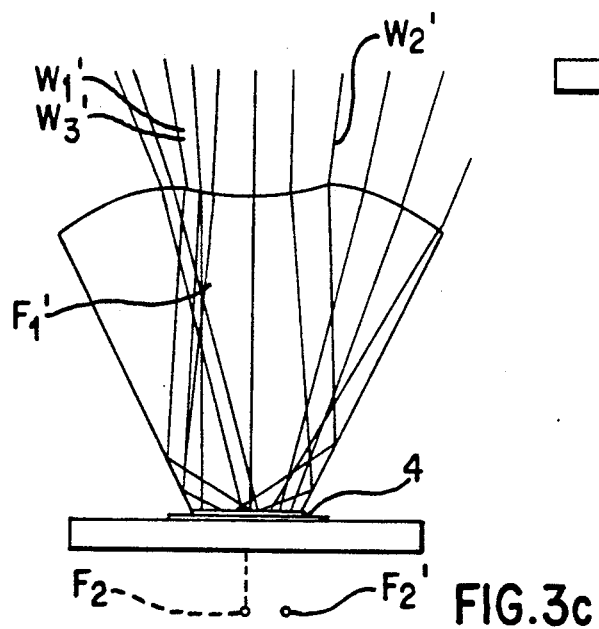

FIG. 3c demonstrates the capability of lens 12 to center even stray rays. Focal line $F_1'$ is moved to the left, and focal line $F_2'$ is moved to the right. All dislocated rays still impinge either directly or after a total reflection on the planes $S_1$ and $S_2$ on the photovoltaic cell 4.

We claim:

1. A solar power plant platform rotatable around its vertical axis with concentrating means, which direct the sun rays by an optical system onto energy converters, characterized in that the optical system consists of optical concentrating panels (3) covering the aperture surface, having a first set of prisms extending horizontally, concentrating the sun rays (R) into wedges of rays ($W_1$, $W_2$ and $W_3$) and a second set of prisms running perpendicular to said first set of prisms by which the wedges of rays ($W_1$) originated by sun rays ($R_1$) with a low angle of incidence are refracted downwards forming an acute angle with the vertical whereby their focal point ($B_1$) on the focal line ($F_1$) is averted from the sun while the wedges of rays ($W_3$) originated by the steepest sun rays ($R_3$) form a focal point ($B_3$) on the focal line ($F_3$) directed towards the sun and that the wedges of rays ($W_1$, $W_2$ and $W_3$) are guided to the energy converter through a lens (12), arranged above said energy converter, the lens having a light incident surface and shape to refract the vertically running wedges of rays ($W_2$) with a focal line ($F_2$) below said lens (12) and all other wedges of rays ($W_1$ and $W_3$) in such a way that all rays impinge on the energy converter.

2. A solar power plant according to claim 1, characterized in that the energy converter is a photovoltaic cell (4) and that its upper surface is in direct contact with the lower surface of the secondary lens (12).

3. A solar power plant according to claim 2, characterized in that the photovoltaic cell (4) is in good heat conducting contact with the bottom of a trough (10) which rests on a layer of water (2).

4. A solar power plant according to claim 2, characterized in that the platform is composed of juxtaposed energy tunnels (5) consisting of a bottom portion (1, 10) of sheet metal comprising the photovoltaic cell (4), a roof portion comprising the optical panels (3) and vertically extending members (9), connecting the bottom portion to the roof portion.

5. A solar power plant according to claim 4, characterized in that the vertically extending members (9) consist of tubes acting as down spouts for rain water.

6. A solar power plant according to claim 1, characterized in that lens (12) forms a bar shape and that its entrance surface consists of two convex strips ($E_1$) on both sides of a concave strip ($E_2$).

7. A solar power plant according to claim 6, characterized in that the vertically extending walls ($S_1$ and $S_2$) of lens (12) are symmetrical and converge towards the energy converter (4).

8. A solar power plant according to claim 1, characterized in that the wedges of rays ($W_1$ and $W_3$) with extreme sloping position form almost the same measure of angle with the vertical but with different signs.

9. A solar power plant according to claim 1, characterized in that the optical panels (3) are covered with a multiple of transparent films, whereby the uppermost at the time can be removed if damaged.

* * * * *